United States Patent
Taniguchi et al.

[19]

[11] Patent Number: 5,936,473
[45] Date of Patent: Aug. 10, 1999

[54] CLOCK GENERATOR IN WHICH EXTERNAL OSCILLATOR IS DISABLED AFTER INTERNAL PLL BECOMES LOCKED

[75] Inventors: Naoki Taniguchi; Kenjiro Kanayama; Tsukasa Miyawaki; Hidekazu Saito, all of Kanagawa-ken, Japan

[73] Assignee: Kabushiki Kaisha Toshiba, Kawasaki, Japan

[21] Appl. No.: 08/964,923

[22] Filed: Nov. 5, 1997

[30]  Foreign Application Priority Data

Nov. 6, 1996  [JP]  Japan ................................ 8-294003

[51] Int. Cl.⁶ .............................. H03B 5/36; H03L 7/095
[52] U.S. Cl. .............................. 331/14; 331/18; 331/49; 331/74; 331/158; 331/DIG. 2; 331/DIG. 3
[58] Field of Search ................................ 331/14, 18, 25, 331/DIG. 2, 49, 74, DIG. 3, 158

[56]  References Cited

U.S. PATENT DOCUMENTS

| | | | |
|---|---|---|---|
| 5,126,695 | 6/1992 | Abe | 331/46 |
| 5,606,293 | 2/1997 | Matsui et al. | 331/74 |
| 5,623,234 | 4/1997 | Shaik et al. | 331/49 |
| 5,754,081 | 5/1998 | Kuroiwa et al. | 331/49 |

*Primary Examiner*—Siegfried H. Grimm
*Attorney, Agent, or Firm*—Foley & Lardner

[57]  ABSTRACT

An oscillation circuit stops the oscillation of an external oscillator to reduce the current consumed when a frequency lower than the inherent frequency of the external oscillator is supplied to a microcomputer. A PLL circuit 37 generates a second clock 45 from a first clock 23 output by an oscillation circuit 1. A PLL lock signal 47 is changed from a first level to a second level when the second clock 45 is generated. A selector 39 outputs the second clock 45 as an internal clock 13 when the PLL lock signal 47 is at the second level. The operation of an oscillator 9 is stopped when the PLL lock signal 47 is at the second level.

14 Claims, 6 Drawing Sheets

CLOCK GENERATOR IN WHICH EXTERNAL OSCILLATOR IS DISABLED AFTER INTERNAL PLL BECOMES LOCKED

FIELD OF THE INVENTION

The present invention relates to an oscillation circuit incorporated in a microcomputer or the like for generating an internal clock from an external clock supplied by an external oscillator.

BACKGROUND OF THE INVENTION

Figure 4:
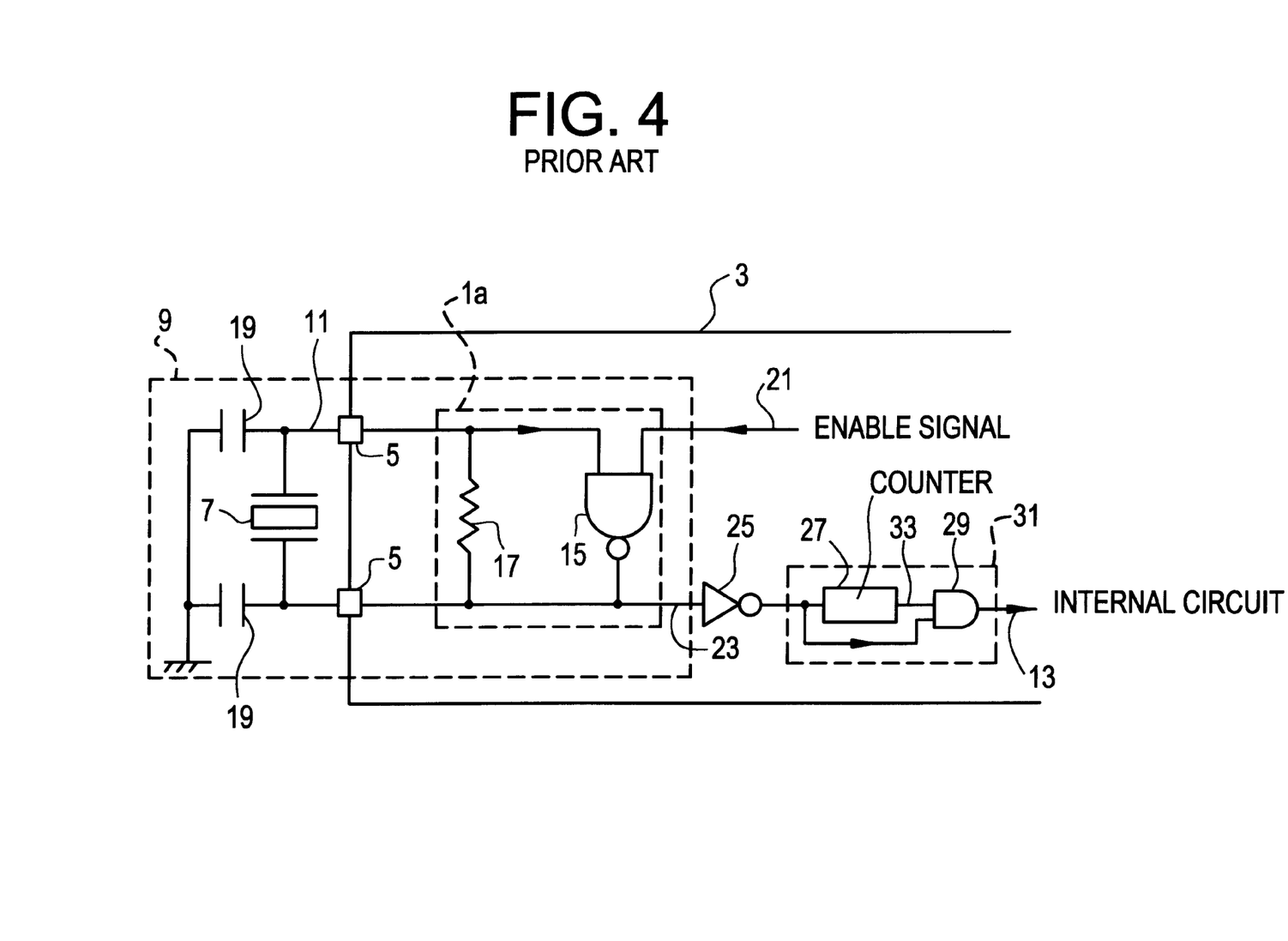
FIG. 4 illustrates a configuration of a conventional oscillation circuit.
Figure 5:
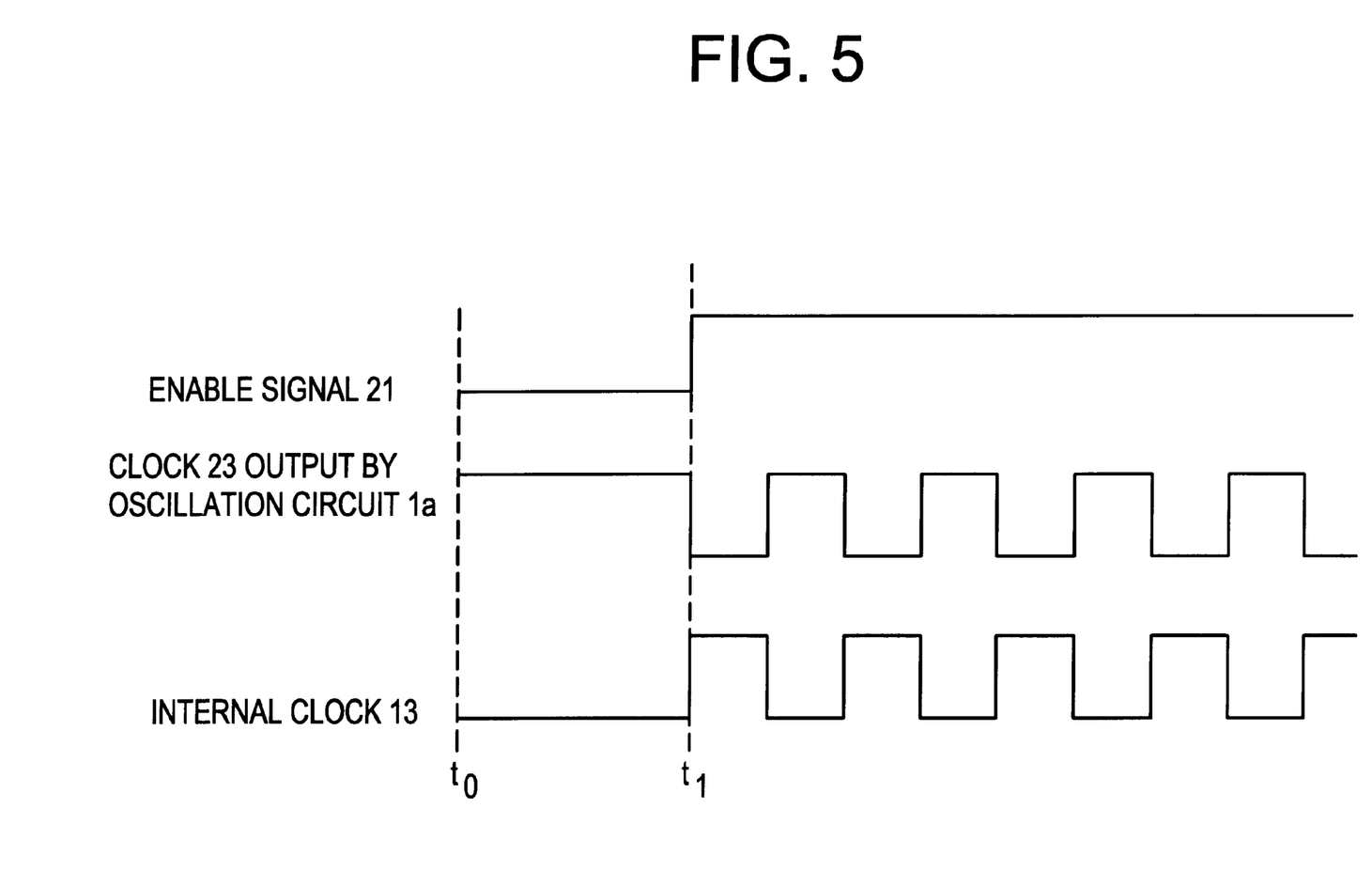
FIG. 5 is a timing chart showing the operation of the oscillation circuit shown in FIG. 4.

FIG. 4 illustrates the configuration of a conventional oscillation circuit, and FIG. 5 is a timing chart showing the operation of the same.

Referring to FIG. 4, an oscillation circuit 1a is provided in a microcomputer 3 and is connected through external terminals 5 to an external oscillator 7 (crystal, ceramic or the like) provided external to the microcomputer 3. In combination with the external oscillator 7 and capacitors. 19, the oscillation circuit 1a constitutes an oscillation device 9 which generates an internal clock 13 from an external clock 11 supplied by the external oscillator 7, and supplies it to the circuits in the microcomputer 3. The oscillation circuit 1a includes a two-input NAND circuit 15 and a resistor 17. The resistor 17 is connected between a first input terminal of the two-input NAND circuit 15 and an output terminal of the same. Additionally, the external oscillator 7 is also parallel-connected through the external terminals 5 as described above. Furthermore, both terminals of the external oscillator 7 are grounded through capacitors 19. The oscillation circuit 1a receives an enable signal 21 at a second input terminal of the two-input NAND circuit 15 to cause the external oscillator 7 to begin oscillating when the enable signal 21 is at a "High (H)" level and to cause the external oscillator 7 to stop oscillating when the enable signal 21 is at a "Low (L)" level.

The operation of the oscillation circuit 1a having such a configuration will be described with reference to the timing chart shown in FIG. 5. In the period between time $t_0$ and $t_1$, an enable signal 21 at the "L" level is output to the second input terminal of the two-input NAND circuit 15 from a CPU (central processing unit which is not shown). Therefore, the output of the two-input NAND circuit 15 always stays at the "H" level during this period regardless of the input to the first input terminal. The external oscillator 7 stops oscillating during this period as described above and therefore the internal clock 13 is not generated. At time $t_1$ and thereafter, an enable signal 21 at the "H" level is output to the second input terminal of the two-input NAND circuit 15 from the CPU. As a result, the output terminal of the two-input NAND circuit 15 outputs a clock signal 23 which is a phase-inverted version of the external clock signal 11 input to the first input terminal. The clock signal 23 output by the oscillation circuit 1a is input to an inverter 25 to be output therefrom as the internal clock 13.

Figure 6:
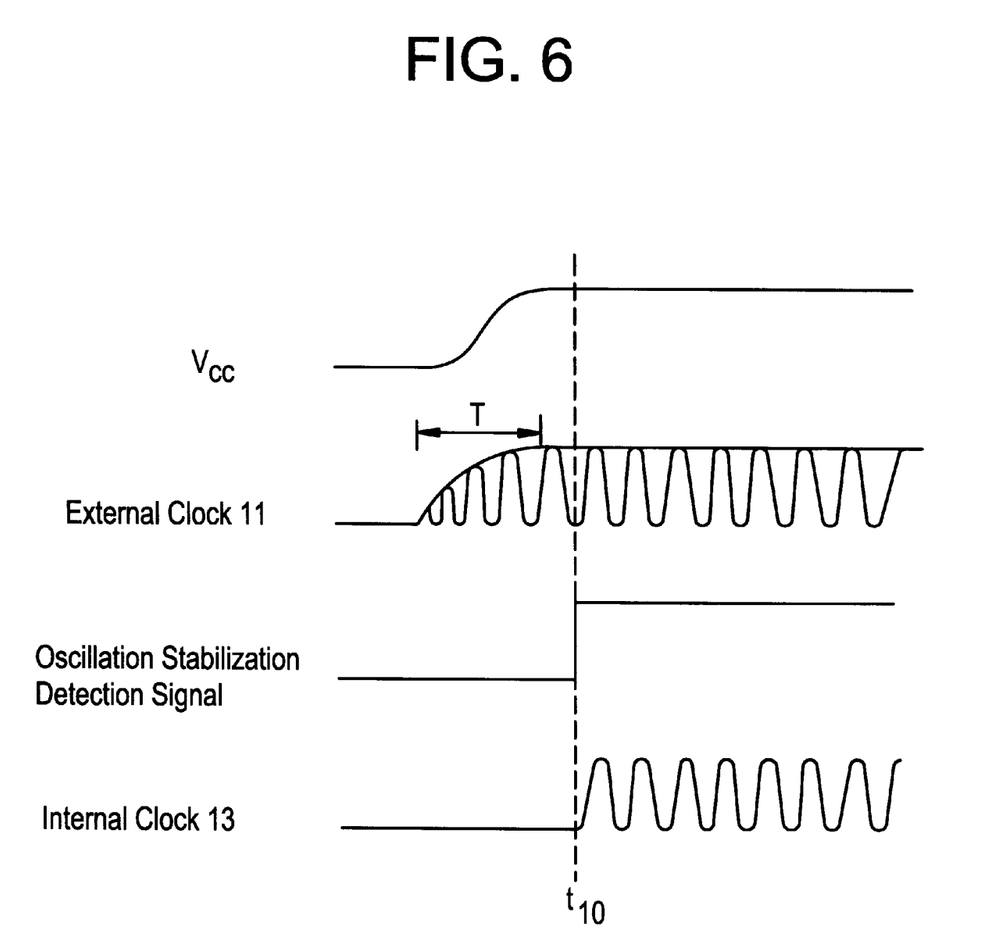
FIG. 6 is a graph explaining the operation of the oscillation stabilizer circuit shown in FIG. 4.

As shown in FIG. 4, the internal clock signal 13 output by the inverter circuit 25 is supplied to an internal circuit (not shown) through an oscillation stabilizer circuit 31 constituted by a counter 27 and a two-input AND circuit 29. As shown in FIG. 6, $V_{CC}$ (power supply voltage) does not rise to a predetermined voltage (e.g., 5 volts) immediately after the power supply is turned on. The external clock 11 (internal clock 13) is therefore stabilized only when a predetermined period of time (the period indicated by T in FIG. 6) has passed and, if such an unstable clock is supplied to the internal circuit, malfunction and errors can occur in the circuit. Therefore, the internal clock 13 is input to the counter 27 which causes an oscillation stabilization detection signal 33 to change from the "L" level to the "H" level (at the point in time indicated by $t_{10}$ in FIG. 6) after counting a predetermined number of clock pulses. As the oscillation stabilization detection signal 33 input to one of the input terminals of the two-input AND circuit 29 achieves the "H" level, the circuit 29 outputs the internal clock 13 input to the other input terminal to supply it to the internal circuit. Thus, the internal clock 13 is supplied to the internal circuit only after being stabilized by the oscillation stabilizer circuit 31.

As described above, the conventional oscillation circuit generates an internal clock from an external clock supplied by an external oscillator and supplies it to an internal circuit. However, the internal circuit is not always required to operate at high speed according to a clock at a high frequency inherent in an external oscillator, for example, in a standby mode. In other words, it may be sufficient for it to operate at a low speed according to the clock at a frequency lower than the inherent frequency of the external oscillator. In such a case, it is very much more advantageous to reduce the current consumed to supply a clock at a minimum required frequency to the internal circuit. For this reason, it is a common practice to reduce the frequency of the clock supplied to an internal circuit for the purpose of reducing the current consumption, and a frequency divider circuit is normally used in such a case. A frequency divider circuit generates a clock at a frequency that is a sub-multiple of the frequency of an internal clock as described, and supplies it to an internal circuit.

However, substantially no reduction of current consumption is achieved in the entire circuit as a whole even when the internal circuit is operated at a low speed according to a low frequency clock obtained by the frequency dividing by the frequency divider circuit in an attempt to reduce the current consumed since the oscillation device itself still uses a clock at a high frequency by operating the external oscillator. This is because the oscillation device typically consumes a current higher than that consumed in the internal circuit, which amounts to a minimal reduction of the current consumed by the entire circuit when the internal circuit operates at a low speed.

The present invention has been conceived taking the above-described situation into consideration, and it is an object of the present invention to provide an oscillation circuit in which a reduction in current consumption can be achieved by stopping the oscillation of an external oscillator when a frequency lower than the inherent frequency of the external oscillator is supplied to a microcomputer. It is another object of the present invention to provide an oscillation circuit in which a clock can be supplied to a microcomputer even when the oscillation of an external oscillator is stopped to prevent malfunction of the microcomputer due to noise from the external oscillator and to eliminate a need for adjusting the external oscillator for stable oscillation.

SUMMARY OF THE INVENTION

In order to achieve the above-described objects, according to the present invention, there is provided an oscillation circuit that forms an oscillation device in combination with an external oscillator for generating an internal clock signal from an external clock signal supplied by the external oscillator, having a clock generation circuit to which a first clock output by the oscillation circuit is input, for generating a second clock at a preset frequency from the first clock and for stopping the operation of the oscillation device and outputting the second clock as an internal clock when the second clock is generated.

The clock generation circuit includes a PLL circuit to which the first clock output by the oscillation circuit is input and which generates the second clock from the first clock based on a preset delay time, outputs a PLL lock signal to the oscillation device and a selector, and changes the PLL lock signal from a first level to a second level when the second clock is generated; and the selector to which the first and second clocks are input and which selects the first clock when the PLL lock signal is at the first level selects the second clock when the PLL lock signal is at the second level. When the PLL lock signal is at the second level, the operation of the oscillation device is stopped, and the second clock is output as the internal clock.

With the above-described configuration, the PLL circuit generates a clock at a desired frequency based on a preset delay time, and the operation of the oscillation device can be stopped while the clock at a desired frequency is being generated. Particularly, the circuit according to the present invention makes it possible to reduce current consumption by an amount corresponding to a current which is otherwise consumed in the oscillation device when a clock at a frequency lower than the inherent frequency of an external oscillator is supplied to an internal circuit.

Furthermore, a user can freely change the frequency of the internal clock by providing the PLL circuit with a delay time setting means which allows the delay time to be arbitrarily set.

Furthermore, the frequency supplied to the internal circuit can be increased by providing a frequency divider circuit at the output of the clock generation circuit.

DETAILED DESCRIPTION OF THE PREFERRED EMBODIMENTS

Figure 1:
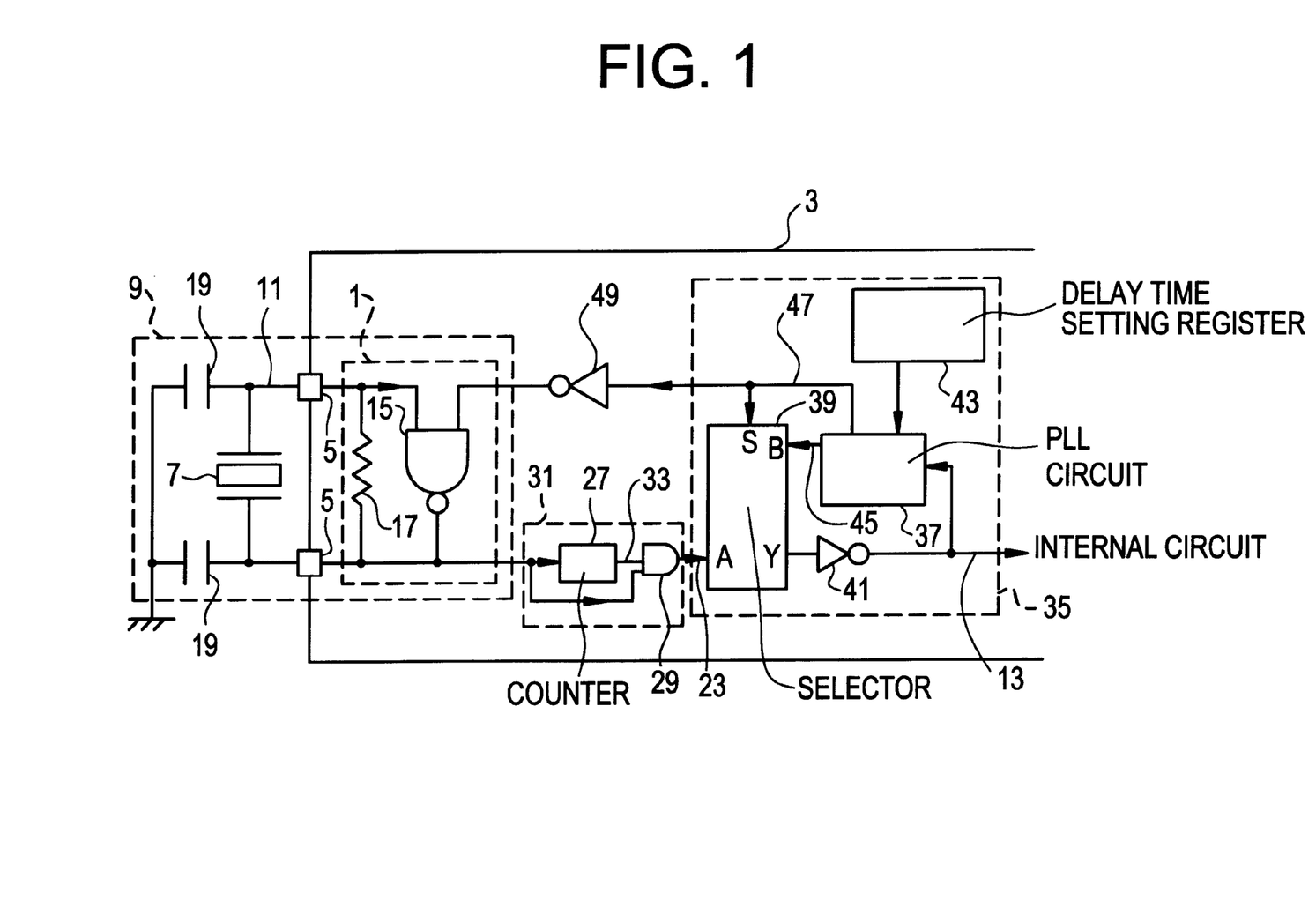
FIG. 1 illustrates a configuration of an oscillation circuit according to an embodiment of the present invention.
Figure 2:
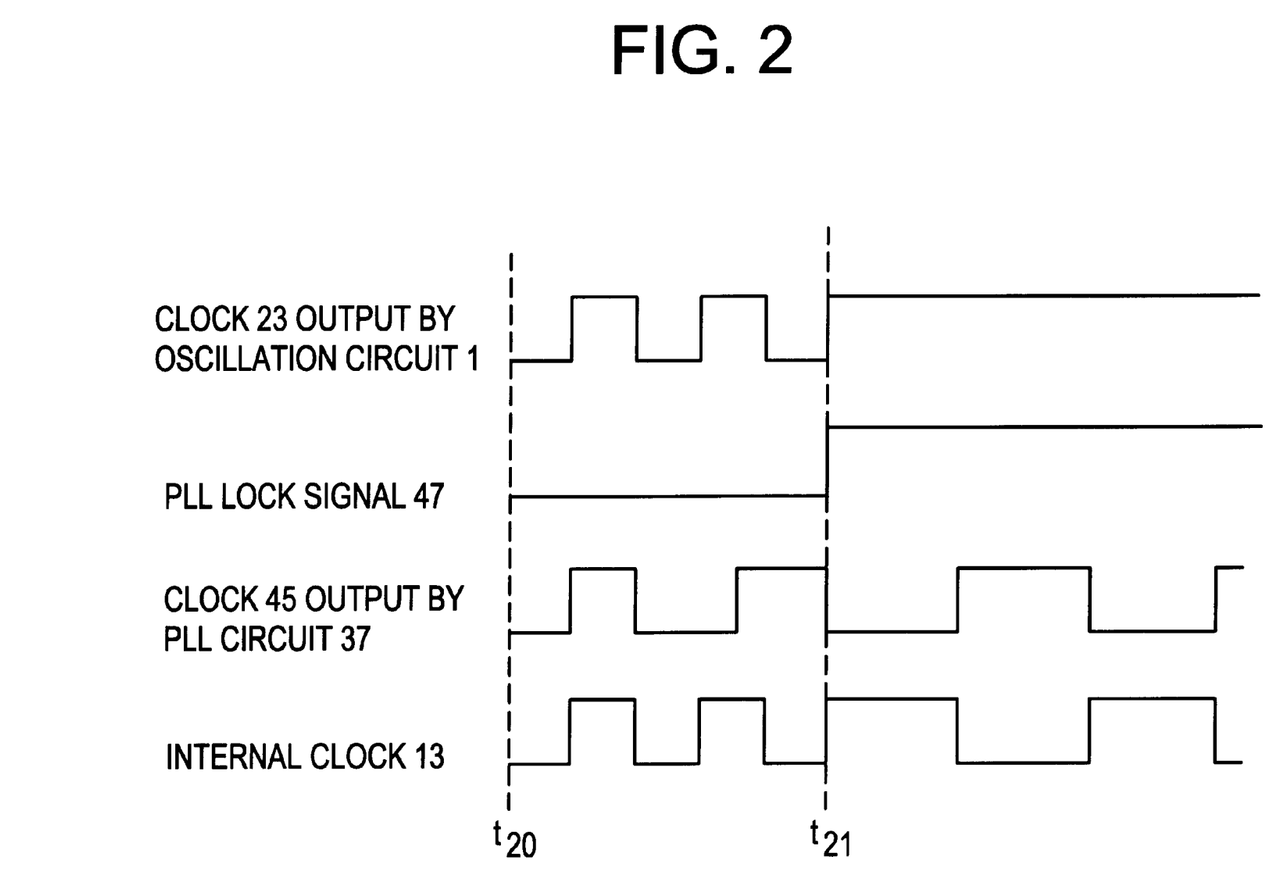
FIG. 2 is a timing chart for the operation of the oscillation circuit shown in FIG. 1.

An embodiment of the present invention will now be described with reference to the drawings. FIG. 1 illustrates an oscillation circuit according to the embodiment of the present invention. FIG. 2 is a timing chart for the operation of the same.

Referring to FIG. 1, an oscillation circuit 1 according to the present embodiment is provided in a microcomputer 3 and is connected through external terminals 5 to an external oscillator 7 (crystal, ceramic or the like) which is located external to the microcomputer 3. In combination with the external oscillator 7 and capacitors 19, the oscillation circuit 1 constitutes an oscillation device 9 which generates an internal clock signal 13 from an external clock 11 supplied by the external oscillator 7 and supplies it to the microcomputer 3. The oscillation circuit 1 includes a two-input NAND circuit 15 and a resistor 17. The resistor 17 is connected between a first input terminal of the two-input NAND circuit 1S and an output terminal of the same. The external oscillator 7 is also parallel-connected through external terminals 5 as described above. Furthermore, both terminals of the external oscillator 7 are grounded through capacitors 19. The internal clock signal 13 is supplied to an internal circuit (not shown) through an oscillation stabilizer circuit 31.

In the oscillation circuit according to the invention, a clock signal 23 output by the oscillation circuit 1 (more particularly, the internal clock signal 13 output through the oscillation stabilizer circuit 31) is passed through a clock generation circuit 35 before being output to the internal circuit as the internal clock signal 13. In the conventional technique, the internal clock signal 13, output by the oscillation circuit 1a, as shown in FIG. 4, (precisely, the internal clock signal 13 output through the oscillation stabilizer circuit 31) is directly supplied to the internal circuit. The clock generation circuit 35 will now be described below.

Referring again to FIG. 1, the clock generation circuit 35 includes a PLL (phase locked loop) circuit 37; a selector 39, an inverter circuit 41, and a delay time setting register 43 (an optional component of clock generation circuit 35). The clock signal 23 output by the oscillation circuit 1 (precisely, the clock signal 23 output by the oscillation stabilizer circuit 31) is input through the selector 39 and inverter 41 to the PLL circuit 37. PLL circuit 37 generates a clock signal 45, which is a sub-multiple of the clock signal 23 based on a preset delay time or a delay time set in the delay time setting register 43, and outputs it to a B-terminal of the selector 39. Furthermore, a PLL lock signal 47 is output to a second input terminal of the two-input NAND circuit 15 that constitutes the oscillation circuit 1 through an inverter circuit 49 and to an S-terminal (select terminal) of the selector 39, The selector 39 connects an A-terminal of the selector 39 to a Y-terminal of the selector 39 whenever the PLL lock signal 47 input to the S-terminal is at the "L" (low) level, and connects the B-terminal of the selector 39 to the Y-terminal whenever the signal is at the "H" (high) level. The delay time setting register 43 is a register which stores data specifying the delay time for the PLL circuit 37 as described above, thereby allowing a user to freely set the delay time for the PLL circuit 37.

The operation of the oscillation circuit according to the present embodiment will now be described with reference to the timing chart shown in FIG. 2.

Referring to FIG. 2, during a period between points in time between $t_{20}$ and $t_{21}$, the PLL circuit 37 outputs the PLL lock signal 47 at the "L" level. The PLL lock signal 47 is changed by the inverter circuit 49 from the "L" level to the "H" level and is input to the second input terminal of the two-input NAND circuit 15. With the "H" level input to the second input terminal, the two-input NAND circuit 15 inverts the phase of the external clock 11 to output it as the clock signal 23. Since the clock signal 23 is output to the A-terminal of the selector 39 through the oscillation stabilizer circuit 31 the stable clock signal 23 is supplied to the selector 39. The PLL lock signal 47 is also output to the S-terminal of the selector 39. When the PLL lock signal 47 is at the "H" level, the selector 39 connects the A-terminal and the Y-terminal to output the clock signal 23 to the inverter circuit 41. The inverter circuit 41 inverts the phase of the clock signal 23 and outputs it to the internal circuit as the internal clock signal 13.

Meanwhile, the internal clock signal 13 is input to the PLL circuit 37 as a feedback signal. The PLL circuit 37 varies the frequency of the internal clock 13 until it matches with the preset delay time or the delay time set by the user in the delay time setting register 43. The clock signal 45 obtained at the PLL circuit 37 by changing the frequency of the internal clock signal 13 is output to the B-terminal of the selector 39. Since the selector 39 connects the A-terminal and the Y-terminal during the period when the PLL lock signal 47 input to the S-terminal is at the "H" level, the clock signal 45 input to the B-terminal is only input to the selector 39, and is not output at the Y-terminal of the selector 39.

Next, when the frequency of the clock signal 45 matches with the preset delay time or the delay time set by the user in the delay time setting register 43 in the PLL circuit 37 at the point in time $t_{21}$ (the PLL circuit 37 enters a locked state), the PLL circuit 37 changes the PLL lock signal 47 from the "L" level to the "H" level. This PLL lock signal 47 is input to the second input terminal of the two-input NAND circuit 15 after being changed from the "H" level to the "L" level by the inverter circuit 49. With the "L" level input to the second terminal, the two-input NAND circuit 15 always outputs the "H" level and, as a result, the external oscillator 7 stops supplying the external clock 11. That is, at the point in time $t_{21}$ and thereafter, since the operation of the oscillation device 9 is stopped, the oscillation device 9 does not supply the clock and no current flows inside the oscillation device 9. The PLL lock signal 47 is also output to the S-terminal of the selector 39. When the PLL lock signal 47 is at the "L" level, since the selector 39 connects the B-terminal and the Y-terminal, the clock signal 45 input to the B-terminal which has been divided by the PLL circuit 37 is output from the Y-terminal. Therefore, the clock signal 45 is subjected to phase inversion at the inverter circuit 41 and is output to the internal circuit as the internal clock signal 13.

At the point in time $t_{21}$ and thereafter, the internal clock signal 13 is input to the PLL circuit 37 as a feedback signal. Since the PLL circuit 37 maintains the frequency of the clock 45 once it enters a locked state as described above, the clock 45, i.e., the internal clock 13, has a constant frequency at the point in time $t_{21}$ and thereafter.

As described above, in the oscillation circuit 1 according to the present embodiment, the PLL circuit 37 to which the external clock 11 supplied by the external oscillator 7 is input generates a clock at a desired frequency based on a preset delay time or a delay time set in the delay time setting register 43 and controls the PLL lock signal 47 while generating the clock at the desired frequency, thereby allowing the operation of the oscillation device 9 including the external oscillator 7 to be stopped. As a result, when a clock at a frequency lower than the inherent frequency of the external oscillator 7 is generated and supplied to the internal circuit, the oscillation circuit 1 according to the present embodiment allows current consumption to be reduced because it stops the operation of the oscillation device 9 to eliminate the current consumed in the oscillation device 9 while supplying a clock at a desired frequency to the internal circuit in contrast to the conventional technique which allows substantially no reduction in current consumption as a whole by the current consumed by the oscillation device itself. Further, it is possible to increase the frequency that can be supplied to the internal circuit by providing a frequency divider circuit according to the conventional technology at the output of the above-described clock generation circuit to perform further frequency division on the clock output by the clock generation circuit.

Figure 3A:
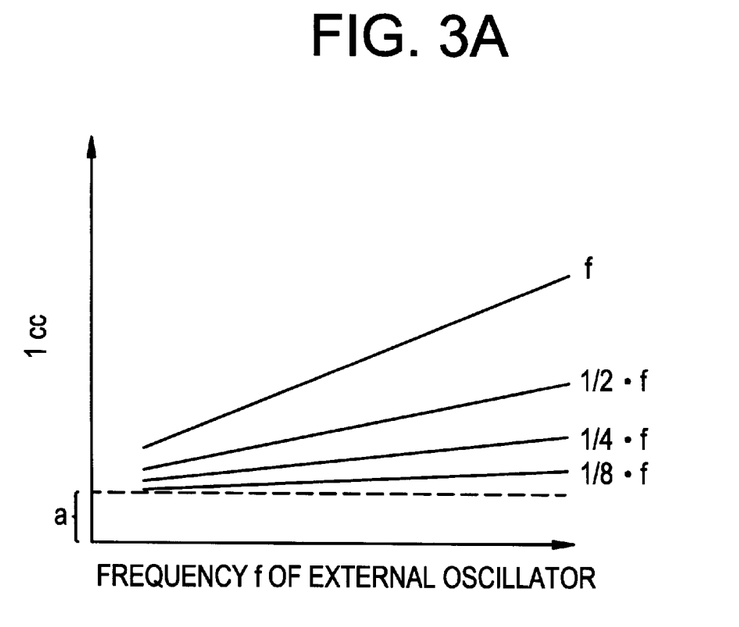
FIG. 3a illustrates the relationship between the current consumed ($I_{CC}$) in a conventional microcomputer incorporating an oscillation circuit and the frequency (f) of an external oscillator.
Figure 3B:
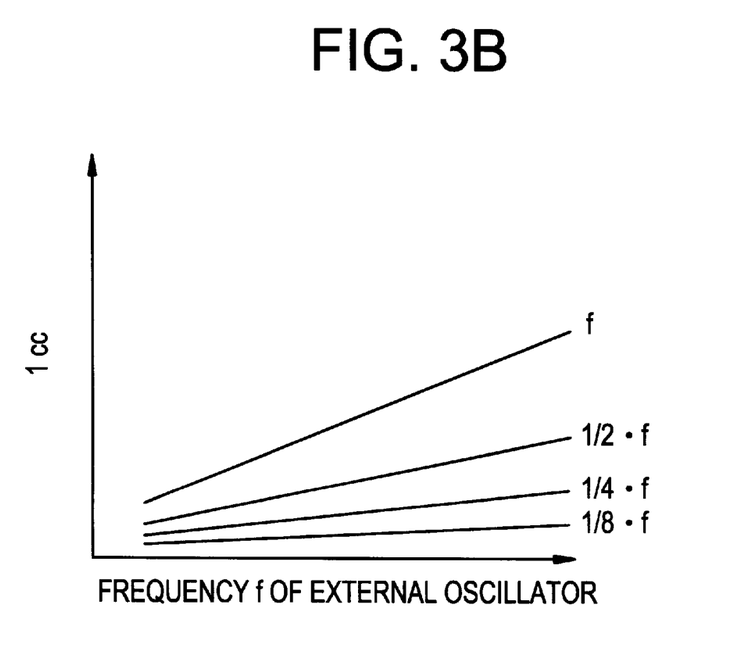
FIG. 3b illustrates the relationship between the current consumed ($I_{CC}$) in a microcomputer incorporating the oscillation circuit according to the embodiment of the present invention and the frequency (f) of an external oscillator.

FIGS. 3a and 3b respectively illustrate the relationship between the current consumed ($I_{cc}$) and the frequency (f) of an external oscillator for a microcomputer incorporating a conventional oscillation circuit and a microcomputer incorporating an oscillation circuit according to the present embodiment. FIG. 3a shows such relationship for the microcomputer incorporating a conventional oscillation circuit. FIG. 3b shows such relationship for the microcomputer incorporating the oscillation circuit according to the present embodiment. As shown in FIG. 3a, a constant current (the current indicated by "a" in FIG. 3a) is always consumed in the microcomputer incorporating a conventional oscillation circuit, and this current is the current consumed by the oscillation device as described above. On the other hand, as is apparent from FIG. 3b, a more significant reduction in current consumption is achieved in the microcomputer incorporating the oscillation circuit according to the present embodiment as a whole in which the current consumed by the oscillation device is eliminated.

As described above, the present invention makes it possible to reduce the current consumed by a system as a whole when a clock at a frequency lower than the inherent frequency of an external oscillator is supplied to a microcomputer as an internal clock because it allows the operation of the oscillation device itself to be stopped while supplying the internal clock.

While the invention has been described in detail and with reference to specific embodiments thereof, it will be apparent to one skilled in the art that various changes and modifications can be made therein without departing from the spirit and scope thereof.

What is claimed is:

1. An oscillation circuit which forms an oscillation device in combination with an external oscillator for generating an internal clock signal from an external clock signal supplied by said external oscillator, comprising:
    a clock generation circuit to which a first clock output by said oscillation circuit is input, for generating a second clock at a preset frequency from said first clock and for stopping the operation of said oscillation device and outputting said second clock as an internal clock when said second clock is generated.

2. The oscillation circuit according to claim 1, wherein said clock generation circuit comprises a phase-lock-loop which receives said preset frequency and said first clock and which outputs said second clock based on said first clock, and
    wherein said phase-lock-loop provides a phase-lock signal when said second clock is generated, said phase-lock signal corresponding to a stop signal for stopping the operation of said oscillation device.

3. An oscillation circuit which forms an oscillation device in combination with an external oscillator for generating an internal clock signal from an external clock signal supplied by said external oscillator, comprising:
    a PLL circuit to which a first clock output by said oscillation circuit is input and which generates a second clock from said first clock based on a preset delay time, outputs a PLL lock signal to said oscillation device, and changes said PLL lock signal from a first level to a second level when said second clock is generated; and
    a selector to which said first and second clocks and said PLL lock signal are input and which selects said first clock when said PLL lock signal is at the first level and selects said second clock when said PLL lock signal is at the second level, wherein said PLL circuit stops the operation of said oscillation device and outputs said second clock as said internal clock when said PLL lock signal is at the second level.

4. The oscillation circuit according to claim 3, wherein said PLL circuit comprises a delay time setting allowing said delay time to be arbitrarily set.

5. The oscillation circuit according to claim 3, further comprising a frequency divider circuit at the output of said PLL circuit.

6. The oscillation circuit according to claim 4, further comprising a frequency divider circuit at the output of said PLL circuit.

7. A circuit, comprising:

an oscillation circuit for generating an internal clock signal from an external clock signal;

a microcomputer coupled to receive the internal clock signal from the oscillation circuit; and means for stopping the generation of the external clock signal to reduce the current consumed when a frequency lower than an inherent frequency of the external clock signal is supplied to the microcomputer.

8. The circuit according to claim 7, wherein said stopping means comprises a phase-lock-loop which detects when a frequency lower than the inherent frequency of the external clock signal is supplied to the microcomputer, and which provides a disable signal to disable the generation of the external clock signal.

9. A circuit comprising:

an oscillation circuit which includes an oscillator;

a PLL circuit for generating a second clock signal from a first clock signal output by the oscillation circuit and changing a PLL lock signal from a first level to a second level when the second clock signal is generated;

a selector for outputting the second clock signal as an internal clock signal when the PLL lock signal is at the second level, wherein the operation of the oscillation circuit is stopped when the PLL lock signal is at the second level.

10. The circuit according to claim 9, wherein the selector is a two-input multiplexer.

11. A clock generating system, comprising:

an oscillation circuit provided in a microcomputer and connected through first and second external terminals to an external oscillator located external to the microcomputer, the external oscillator and the oscillation circuit constituting an oscillation device, the oscillation device generating an internal clock signal from an external clock supplied by the external oscillator and supplying the internal clock signal to the microcomputer, the oscillation circuit including a logic circuit and a resistor, the resistor being connected between a first input terminal of the logic circuit and an output terminal of the logic circuit, the first input terminal of the logic circuit being connected to one of the first and second external terminals and the output terminal of the logic circuit being connected to the other of the first and second external terminals; and a clock generation circuit comprising:

a PLL (phase locked loop) circuit which stops the oscillation of the external oscillator to reduce the current consumed when a frequency lower than an inherent frequency of the external oscillator is supplied to the microcomputer.

12. The clock generating system as recited in claim 11, wherein the clock generation circuit further comprises:

a selector having a first input terminal, a second input terminal, and an output terminal, the first input terminal being connected to the oscillation circuit, the second input terminal being connected to the PLL circuit, and a first inverter being connected between the output terminal of the selector and the PLL circuit; and a delay time setting register connected to the PLL circuit;

wherein a first clock signal output by the oscillation circuit is input through the selector and the first inverter to the PLL circuit to generate a second clock signal, the second clock signal being a sub-multiple of the first clock signal based on a delay time set in the delay time setting register, the second clock signal being supplied to the selector via the second input terminal.

13. The clock generating system as recited in claim 12, wherein a PLL lock signal is output to a second input terminal of the logic circuit through a second inverter and to a control terminal of the selector.

14. The clock generating system as recited in claim 13, wherein the selector connects the first input terminal of the selector to the output terminal of the selector whenever the PLL lock signal input to the control terminal is at a first logic level and connects the second terminal of the selector to the output terminal whenever the PLL lock signal is at a second logic level.

* * * * *